United States Patent
Ogihara et al.

[11] Patent Number: 6,144,043
[45] Date of Patent: Nov. 7, 2000

[54] LIGHT EMITTING SEMICONDUCTOR DEVICE HAVING PLURAL LIGHT EMITTING ELEMENTS WITH DIFFERENT JUNCTION DEPTH

[75] Inventors: Mitsuhiko Ogihara; Yukio Nakamura; Hiroshi Hamano; Masumi Taninaka, all of Tokyo, Japan

[73] Assignee: Oki Electric Industry Co., Ltd., Tokyo, Japan

[21] Appl. No.: 09/188,896

[22] Filed: Nov. 10, 1998

[30] Foreign Application Priority Data

Feb. 13, 1998 [JP] Japan .................................. 10-031200

[51] Int. Cl.[7] .................................................. H01L 33/00
[52] U.S. Cl. .................................. 257/88; 257/89; 257/90
[58] Field of Search .............................. 257/88, 79, 89, 257/90, 94, 96; 362/252

[56] References Cited

U.S. PATENT DOCUMENTS

| | | | |
|---|---|---|---|
| 4,148,045 | 4/1979 | Fang et al. | 257/88 |
| 4,199,385 | 4/1980 | Hung et al. | 257/88 |

OTHER PUBLICATIONS

"Hakkou–daiodo" (Light Eitting Diode), Okuno, pp. 27–30 Sangyo Tosho Inc., 1994.

*Primary Examiner*—Minh Loan Tran
*Attorney, Agent, or Firm*—Jones Volentine, LLC

[57] ABSTRACT

A light emitting semiconductor device in which LEDs for emitting light different in wavelength from one another are densely integrated. First to fifth semiconductor layers are AlGaAs layers being different in Al composition ratio, and when it is assumed that the energy band gaps of the first to fifth semiconductor layers are respectively Eg1, Eg2, Eg3, Eg4 and Eg5, they satisfy the relation that Eg1<Eg2<Eg3<Eg4 and Eg1<Eg5. The pn fronts formed by p-type domains and the n-type domain of the semiconductor body are individually formed in the first semiconductor layer, the second semiconductor layer and the third semiconductor layer which form a stacked semiconductor layer. The LEDs emit light having wavelengths corresponding to the energy band gaps of the semiconductor layers in which the pn fronts are formed. These LEDs are integrated at intervals of a pitch between the p-type domains or the p-type electrodes.

11 Claims, 14 Drawing Sheets

LIGHT EMITTING SEMICONDUCTOR DEVICE HAVING PLURAL LIGHT EMITTING ELEMENTS WITH DIFFERENT JUNCTION DEPTH

BACKGROUND OF THE INVENTION

1. Field of the Invention

The present invention relates to a light emitting semiconductor device having such light emitting devices as light emitting diodes (LEDs) or the like having pn junctions, said light emitting devices being integrated in the same semiconductor body.

2. Description of Related Art

An example of conventional light emitting semiconductor devices has been disclosed in a reference literature "Hakkou-daiodo" (Light Emitting Diode) (pp.27 to 30 by OKUNO, issued by Sangyo Tosho Inc. 1994). FIG. 14 is a sectional view showing the structure of LEDs in a conventional light emitting semiconductor device. An LED shown in FIG. 14(A) is composed of a semiconductor body 10 having a homo-junction by an n-type GaP layer 12/a p-type GaP layer 13, the homo-junction being formed on a GaP substrate 11, a p side electrode 14 to be an individual electrode of each LED, and an n side electrode 15 to be a common electrode to plural LEDs, wherein this homo-junction interface is a pn junction interface 16.

An LED shown in FIG. 14(B) is composed of a semiconductor body 20 having a single hetero-junction of a p-type $Al_xGa_{1-x}As$ (x=0.35) layer 22/an n-type $Al_xGa_{1-x}As$ (x=0.65) layer 23, the single hetero-junction being formed on a GaAs substrate 21, an n side electrode 24 to be an individual electrode, and a p side electrode 25 to be a common electrode, wherein this hetero-junction interface is a pn junction interface.

An LED shown in FIG. 14(C) is composed of a semiconductor body 30 having a double hetero-junction of a p-type $Al_xGa_{1-x}As$ (x=0.65) layer 31/a p-type $Al_xGa_{1-x}As$ (x=0.65) layer 22/an n-type $Al_xGa_{1-x}As$ (x=0.65) layer 23, an n side electrode 24, and a p side electrode 25, wherein the hetero-junction interface of the AlGaAs (x=0.35) layer 22/the AlGaAs (x=0.65) layer 23 is a pn junction interface.

In case of the LEDs shown in FIGS. 14(B) and 14(C) each of which has a hetero-junction, an emitted light has a wavelength corresponding to the energy band gap of the p-type AlGaAs (x=0.65) layer 22 which is a light emitting layer.

However, an LED of these conventional semiconductor devices emits a light having a determined single wavelength, and in these conventional structures an integration density of LEDs having different wavelengths is at most 600 dpi and it has been difficult to integrate the LEDs in a higher density than 600 dpi.

SUMMARY OF THE INVENTION

The present invention has been developed for the purpose of solving one or more of the problems due to the limitations and disadvantages of the related art, and a first object of the invention is to provide a light emitting semiconductor device in which LEDs emitting lights being different in wavelength from one another can be densely integrated in the same semiconductor body.

A second object of the invention is to provide a method for manufacturing such a light emitting semiconductor device as this.

According to a first aspect of the present invention, a semiconductor device of the invention includes:

a semiconductor body having a first conductive-type domain and a plurality of individual second conductive-type domains, a first conductive side electrode to be in contact with the first conductive-type domain, and a plurality of second conductive side electrodes to be individually in contact with the plurality of second conductive-type domains. The semiconductor body comprises a stacked semiconductor layer formed by stacking a plurality of semiconductor layers each of which is a light emitting layer. The stacked semiconductor layer partially forms the first conductive-type domain. The second conductive-type domains are, respectively, formed from parts of the upside of the semiconductor body to depths reaching the semiconductor layers different from one another. The first conductive-type domain and each of the second conductive-type domains forms individually a pn junction interface. The semiconductor layers have energy band gaps different from one another. These semiconductor layers are stacked in increasing order of energy band gap from the lower side of the semiconductor body to the upper side thereof to form said stacked semiconductor layer. One or more front portions of a pn junction interface are formed in each of the semiconductor layers.

According to a second aspect of the present invention, a method of the invention forms a semiconductor body by providing a stacked semiconductor layer on a semiconductor substrate. This stacked semiconductor body is formed by stacking a plurality of first conductive-type semiconductive layers being different in energy band gap from one another on the semiconductor substrate in increasing order of energy band gap. Then a plurality of second conductive-type domains are individually formed in this semiconductor body. These second conductive-type domains are formed by doping a second conductive-type impurity into this semiconductor body to depths different from one another from a plurality of upside areas (i.e., upper surface area) of the semiconductor body separated from one another. At this time, the second conductive-type domains are formed so that one or more front portions of a pn junction interface are located in each of the semiconductor layers in the stacked semiconductor layer. Thus, a plurality of pn junction interfaces are formed by the first conductive-type semiconductor layer domain and the second conductive-type domains.

BRIEF DESCRIPTION OF THE DRAWINGS

The foregoing and other objects, features and advantages of the present invention will be better understood from the following description taken in connection with accompanying drawings, in which.

DESCRIPTION OF THE PREFERRED EMBODIMENTS

A light emitting semiconductor device of the present invention and a method for manufacturing it are described with reference to the drawings in the following. The drawings show its components roughly in shape, size and positional relationship so that the present invention can be understood. Embodiments described below are only simple examples and the present invention is not limited to these embodiments.

First Embodiment

Figure 1:
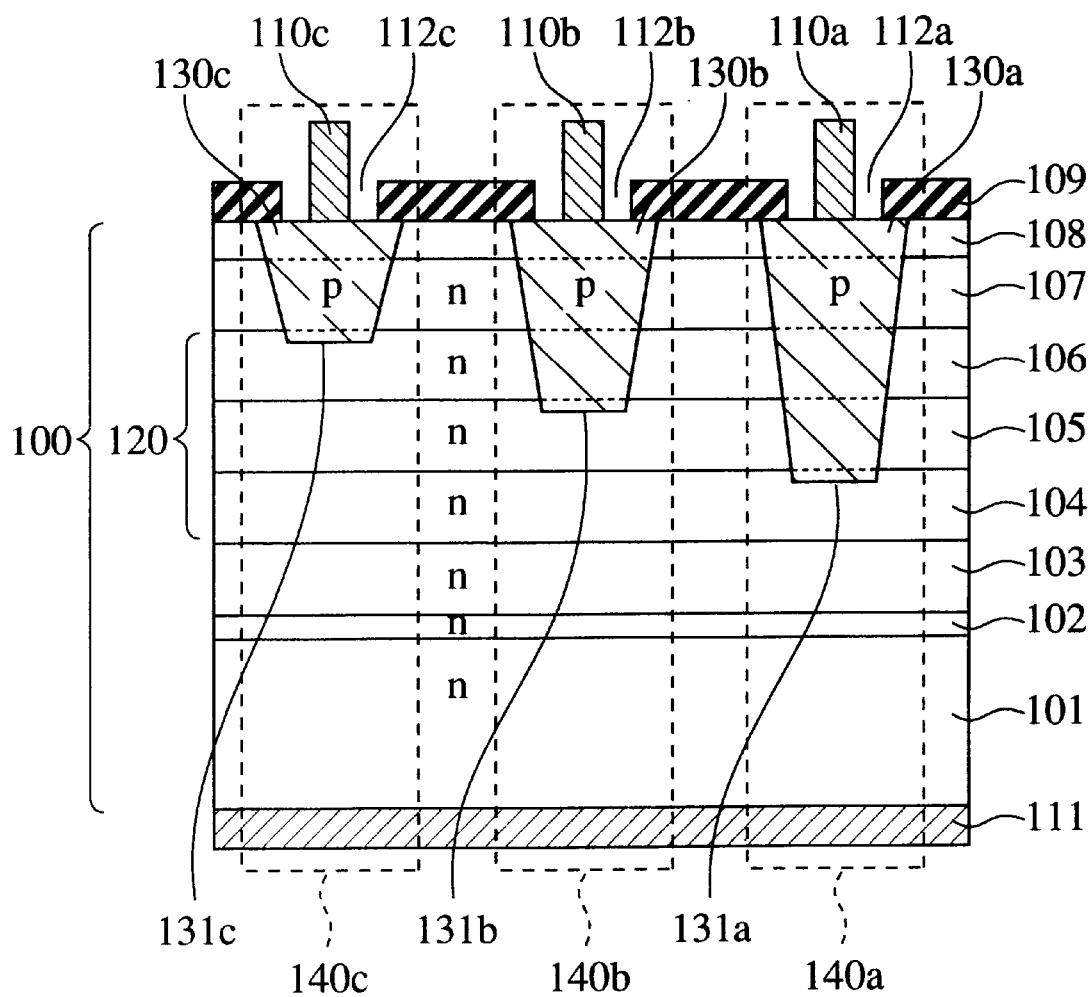
FIG. 1 is a sectional view showing the structure of a light emitting semiconductor device of a first embodiment of the present invention.
Figure 2:
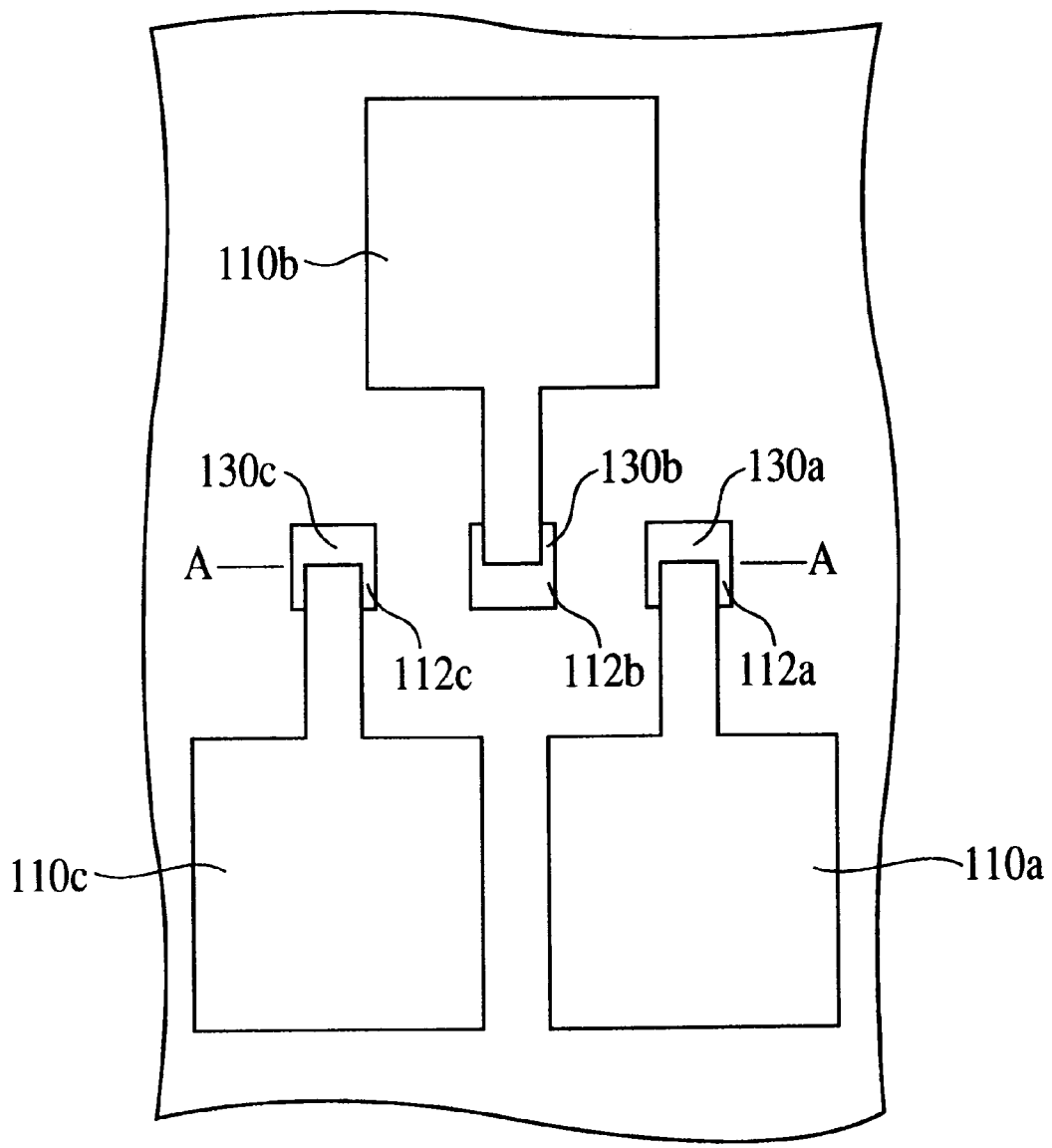
FIG. 2 is an upside plan view showing the structure of the light emitting semiconductor device of the first embodiment of the present invention.

FIG. 1 is a sectional view showing the structure of a light emitting semiconductor device of a first embodiment of the present invention. FIG. 2 is a an upside plan view showing the structure of the light emitting semiconductor device of the first embodiment of the present invention. FIG. 1 is a sectional view taken along a line A—A of FIG. 2. A light emitting semiconductor device having the structure shown in FIGS. 1 and 2 is a surface emitting type light emitting device. The device is provided with a semiconductor body 100, an interlayer insulating film 109, p side electrodes 110a, 110b and 110c, and an n side electrode 111.

The semiconductor body 100 has an n-type GaAs (gallium arsenide) substrate 101, and an n-type GaAs buffer layer 102, an n-type $Al_sGa_{1-s}As$ (a mixed crystal of arsenic, gallium and aluminum) layer (fifth semiconductor layer) 103, an n-type $Al_xGa_{1-x}As$ layer (first semiconductor layer) 104, an n-type $Al_yGa_{1-y}As$ layer (second semiconductor layer) 105, an n-type $Al_zGa_{1-z}As$ layer (third semiconductor layer) 106, an n-type $Al_tGa_{1-t}As$ layer (fourth semiconductor layer) 107, and a semi-insulating GaAs layer 108 which are stacked in sequence on this n-type GaAs semiconductor substrate 101. Moreover, this semiconductor body 100 has second conductive-type areas, that is, its upper surface area, that is, its upper surface domains, namely, p-type domains 130a, 130b and 130c which are individually formed from its upside areas, that is, its upper surface areas. Each of the above-mentioned x, y, z, t and s represents a composition ratio of Al to As, and each of the 1-x, 1-y, 1-z, 1-t and 1-s represents a composition ratio of Ga to As. In this constructional example, the first to third semiconductor layers 104 to 106 form a stacked semiconductor layer 120 to be a light emitting layer. The stacked semiconductor layer 120 includes therein the first conductive-type domain and portions of the second conductive-type domains. Hereinafter, this stacked semiconductor layer 120 may also be referred to as a semiconductor layer group.

The stacked semiconductor layer 120 has a structure in which semiconductor layers being different in energy band gap from one another are stacked from the lower side to the upper side (from the downside (reverse face side) of the semiconductor body 100 to the upside (obverse face side) thereof) in increasing order of energy band gap. Therefore, the energy band gaps are larger in order of the first semiconductor layer 104, the second semiconductor layer 105 and the third semiconductor layer 106. The fourth semiconductor layer 107 and the fifth semiconductor layer 103 are semiconductor layers to be cladding layers. The fourth semiconductor layer 107 is an upper semiconductor layer being larger in energy band gap than the third semiconductor layer 106. The fifth semiconductor layer 103 is a lower semiconductor layer being larger in energy band gap than the first semiconductor layer 104. Accordingly, when it is assumed that the energy band gaps of the first semiconductor layer 104 to the fourth semiconductor layer 107 and the fifth semiconductor layer 103 are, respectively, Eg1, Eg2, Eg3, Eg4 and Eg5, semiconductor materials satisfying the following expressions (1) and (2) for the first semiconductor layer 104 to the fourth semiconductor layer 107 and the fifth semiconductor layer 103:

$$Eg1<Eg2<Eg3<Eg4 \quad (1)$$

$$Eg1<Eg5 \quad (2)$$

The more the composition ratio of Al is, the larger the AlGaAs which is a material for the first semiconductor layer 104 to the fourth semiconductor layer 107 and the fifth semiconductor layer 103 is in energy band gap, and therefore the Al composition ratios x, y, z, t and s in the first to fifth semiconductor layers 104 to 107 and 103 are set so as to meet the following expressions (3) and (4):

$$0 \leq x<y<z<t \leq 1 \quad (3)$$

$$0 \leq x<s \leq 1 \quad (4).$$

For example, it is possible to set that x=0.1, y=0.25, z=0.4, t=s=0.6.

The p-type domains 130a, 130b and 130c which are the second conductive-type domains are formed to depths different from one another by doping a p-type impurity selectively into the semiconductor body 100 from its individual upside areas. For example, Zn (zinc) is used as the p-type impurity. The first p-type domain 130a is formed in a partial domain of each of the GaAs layer 108 and the fourth semiconductor layer 107 to the first semiconductor layer 104 in a continuous manner. The second p-type domain 130b is formed in a partial domain of each of the GaAs layer 108 and the fourth semiconductor layer 107 to the second semiconductor layer 105 in a continuous manner. The third p-type domain 130c is formed in a partial domain of each of the GaAs layer 108 and the fourth semiconductor layer 107 to the third semiconductor layer 106 in a continuous manner. Therefore, p-type domains and n-type domains are formed in the first semiconductor layer 104 to the fourth semiconductor layer 107, and p-type domains and semi-insulating domains are formed in the GaAs layer 108.

The first pn junction interface is formed by the first p-type domain 130a and the n-type domains of the first semiconductor layer 104 to the fourth semiconductor layer 107. The second pn junction interface is formed by the second p-type domain 130b and the n-type domains of the second semiconductor layer 105 to the fourth semiconductor layer 107. The third pn junction interface is formed by the third p-type domain 130c and the n-type domains of the third semiconductor layer 106 and the fourth semiconductor layer 107. The front portion (pn front) 131a of the first pn junction interface is inside the first semiconductor layer 104, the front portion 131b of the second pn junction interface is inside the second semiconductor layer 105, and the front portion 131c of the third pn junction interface is inside the third semiconductor layer 106. Hereupon, the front portion of a pn junction interface (pn front) is a part of the pn junction interface formed by the p-type domain and the n-type domain, the part being located at the deepest position from the upside of the semiconductor substrate 100 and being nearly in parallel with the upside surface of the semiconductor body 100.

An interlayer insulating film 109 is formed on the upside surface of the semiconductor body 100 (the upside surface of the GaAs layer 108). A silicon nitride film (SiN film) is preferably used as this interlayer insulating film 109. Openings 112a, 112b and 112c to expose respectively the surfaces of the p-type domains 130a, 130b and 130c are formed in this interlayer insulating film 109. Further, p side electrodes 110a, 110b and 110c are provided respectively as individual electrodes on the upside of the semiconductor body 100 on which the interlayer insulating film 109 is formed. The first p side electrode 110a is in ohmic contact with the first p-type domain 130a in the first opening 112a. The second p side electrode 110b is in ohmic contact with the second p-type domain 130b in the second opening 112b. The third p side electrode 110c is in ohmic contact with the third p-type domain 130c in the third opening 112c.

The GaAs layer 108 as the top layer of the semiconductor body 100 is provided in order to bring the p side electrodes 110a, 110b, 110c into ohmic contact with the p-type domains 130a, 130b, 130c. An n side electrode 111 is provided as a common electrode on the downside of the semiconductor body 100 (on the downside of an n-type GaAs substrate 101). This n side electrode 111 is in ohmic contact with an n-type domain (n-type GaAs substrate 101) of the semiconductor body 100.

A first LED 140a is composed of the first p side electrode 110a, the p-type domain 130a, the n-type domain of the semiconductor body 100, and the n side electrode 111. A second LED 140b is composed of the second p side electrode 110b, the p-type domain 130b, the n-type domain of the semiconductor body 100, and the n side electrode 111. A third LED 140c is composed of the third p side electrode 110c, the p-type domain 130c, the n-type domain of the semiconductor body 100, and the n side electrode 111. That is to say, LEDs of three kinds (three LEDs) emitting lights different in wavelength from one another are integrated in the light emitting semiconductor device shown in FIGS. 1 and 2. These LEDs are integrated in high density at intervals of a pitch between the p-type domains 130a, 130b, 130c or the p side electrodes 110a, 110b, 110c.

Figure 3:
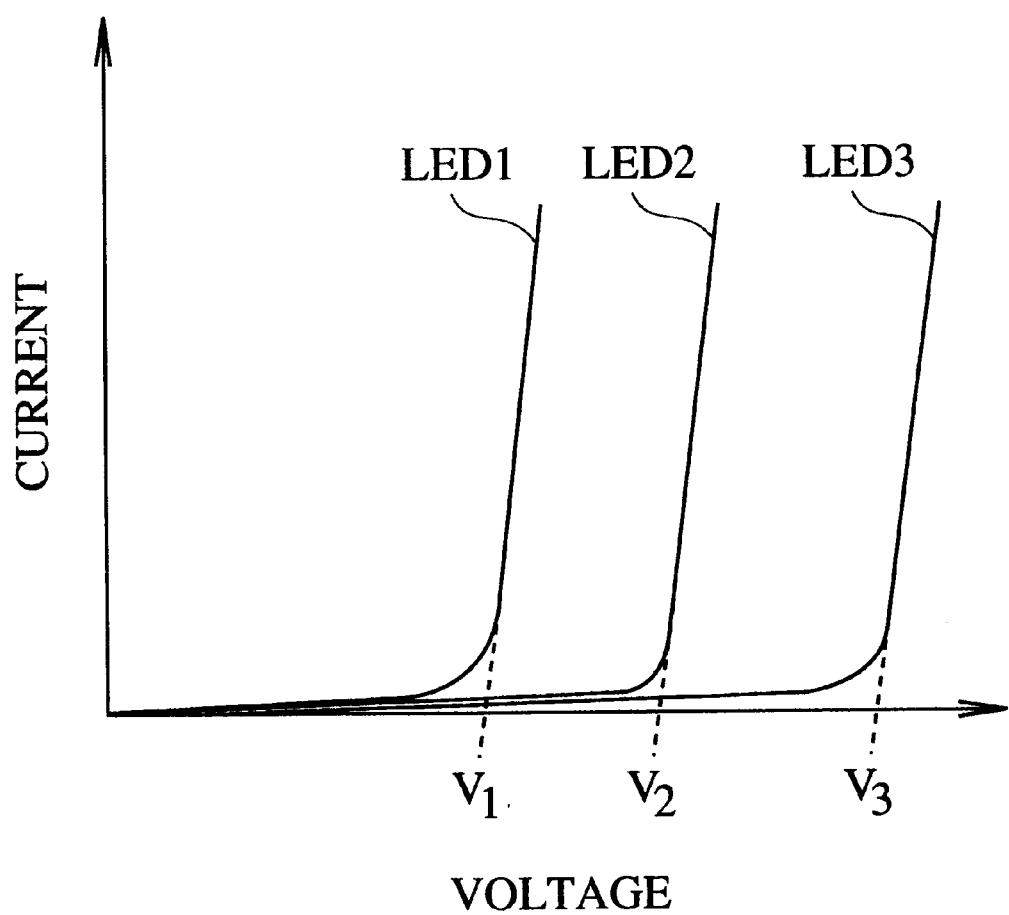
FIG. 3 shows current-voltage characteristics of LEDs in the light emitting semiconductor device of the first embodiment of the present invention.
Figure 4A:
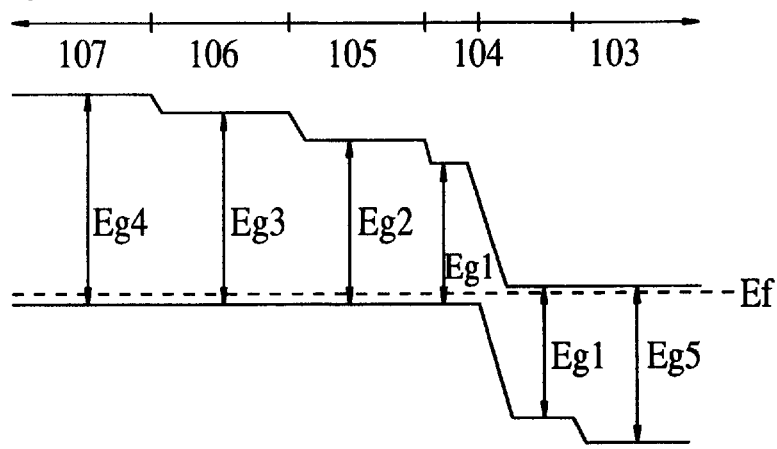
FIGS. 4(A)–4(C) show schematic diagrams of energy bands of the LEDs of the light emitting semiconductor device of the first embodiment of the present invention.
Figure 4B:
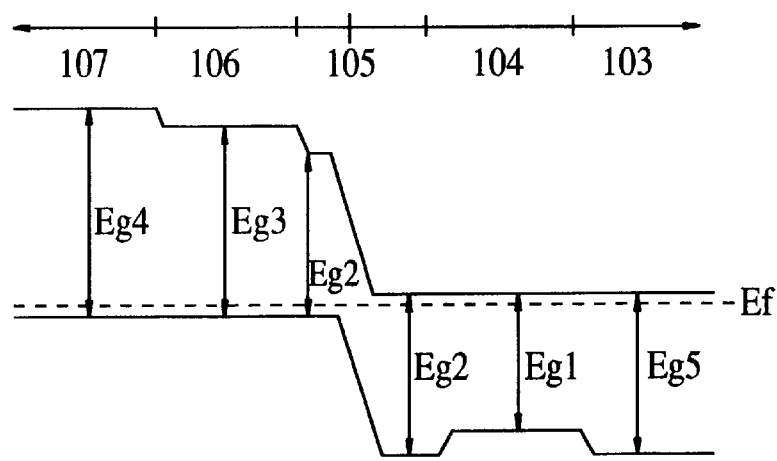
Figure 4C:
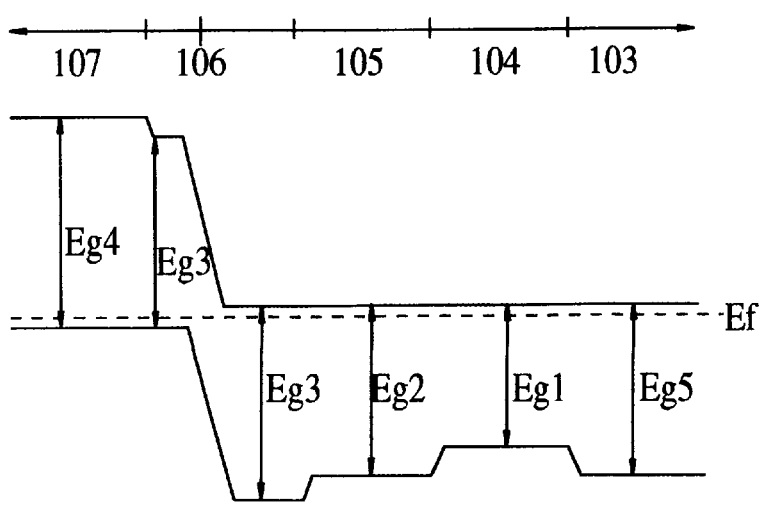

Next, operation of the light emitting semiconductor device shown in FIGS. 1 and 2 will be described in the following. FIG. 3 shows current-voltage characteristics of the first LED 140a (LED1), the second LED 140b (LED2), and the third LED 140c (LED3) FIG. 4 represents schematic diagrams showing energy bands of the LED1, LED2 and LED3, and FIG. 4(A) is an energy band diagram of the LED1, FIG. 4(B) is an energy band diagram of the LED2, and FIG. 4(C) is an energy band diagram of the LED3. FIGS. 4 are energy band diagrams in case of applying no voltage to the LEDs from the outside, and show energy bands in the direction of depth including a pn front. Here, Ef in each of the diagrams represents a Fermi level.

As shown in FIG. 3, an electric current rises when a voltage equal to or greater than a threshold voltage V1 is applied between the first p side electrode 110a and the n side electrode 111 in LED1, thereby the LED1 emits a light of λ1 in wavelength. The LED2 emits a light of λ2 in wavelength when a voltage equal to or greater than a threshold voltage V2 is applied between the second p side electrode 110b and the n side electrode 111. The LED3 emits a light of λ3 in wavelength when a voltage equal to or greater than a threshold voltage V3 is applied between the second p side electrode 110c and the n side electrode 111, where V1<V2<V3 and λ1>λ2>λ3. For example, when the Al composition ratios x, y and z in the first to third semiconductor layers 104 to 106 are respectively x=0.1, y=0.25 and z=0.4, V1 is about 1.6 V, V2 is about 1.7 V and V3 is about 1.9 V, and λ1 is about 780 nm, λ2 is about 730 nm and λ3 is about 650 nm.

A stacked semiconductor layer, namely, a semiconductor layer group 120 is formed out of N (which is an integer of two or more) semiconductor layers which are stacked in increasing order of energy band gap from the lower side to the upper side (these semiconductor layers are referred to as the first to Nth semiconductor layers, respectively, in sequence from the lower side of the substrate), the first to Nth p-type domains and the first to Nth p side electrodes are provided, and the kth (k is an arbitrary integer from 1 to N) pn front made by the kth p-type domain is located inside the kth semiconductor layer, and thereby N pieces of LED emitting lights different in wavelength from one another can be integrated.

A light emitting semiconductor device of the present invention has a structure in which each of semiconductor layers being upper than the semiconductor layer having a pn front formed in it (being at the upper side of the semiconductor body) is greater in energy band gap than the semiconductor layer having the pn front formed in it. In the LED 140 having this structure, no carrier is injected through pn junctions formed in semiconductor layers being upper than the semiconductor layer having therein a pn front 131. Therefore, nearly all current flows through the pn junction inside the semiconductor layer having therein the pn front 131. Thus, almost all light is generated in the vicinity of the pn junction inside the semiconductor layer having therein the pn front 131. Due to this, the wavelength of a light emitted from the LED 140 is made into a wavelength corresponding to the energy band gap of the semiconductor layer having the pn front 131 (light emitting layer). Furthermore, since a light generated in the light emitting layer is not absorbed in an upper layer being greater in energy band gap than the light emitting layer, the light emitting efficiency of each LED can be made high. An electron injected into the light emitting layer is confined by the energy barrier of the upper semiconductor layer, and a positive hole injected into the light emitting layer is confined by the energy barrier of the lower semiconductor layer. As a result, the light emitting efficiency of each LED can be made high also by this injected carrier confining effect.

In LED1, as shown in FIG. 4(A), an electron injected from the n side electrode 111 into the first semiconductor layer 104 and a positive hole injected from the first p side electrode 110a into the first semiconductor layer 104 are confined inside the first semiconductor layer 104, respectively, by the energy barrier (energy barrier at the conduction band side) formed in the interface between the second semiconductor layer 105 and the first semiconductor layer 104 and the energy barrier (energy barrier at the valence band side) formed in the interface between the fifth semiconductor layer 103 and the first semiconductor layer 104, and the electron and the hole are recombined in the vicinity of the pn junction inside the first semiconductor layer 104 to emit a light. This light passes the second semiconductor layer 105 to the fourth semiconductor layer 107 without being absorbed in the least, and is emitted through the first opening 112a and its peripheral part.

In LED2, as shown in FIG. 4(B), injected carriers are confined inside the second semiconductor layer 105, and are recombined in the vicinity of the pn junction inside the second semiconductor layer 105 to emit a light. This light passes the third semiconductor layer 106 to the fourth semiconductor layer 107 without being absorbed in the least, and is emitted through the second opening 112b and its peripheral part.

In LED3, as shown in FIG. 4(C), injected carriers are confined inside the third semiconductor layer 106, and are recombined in the vicinity of the pn junction inside the third semiconductor layer 106 to emit a light. This light passes the fourth semiconductor layer 107 without being absorbed in the least, and is emitted through the third opening 112c and its peripheral part.

Figure 5:
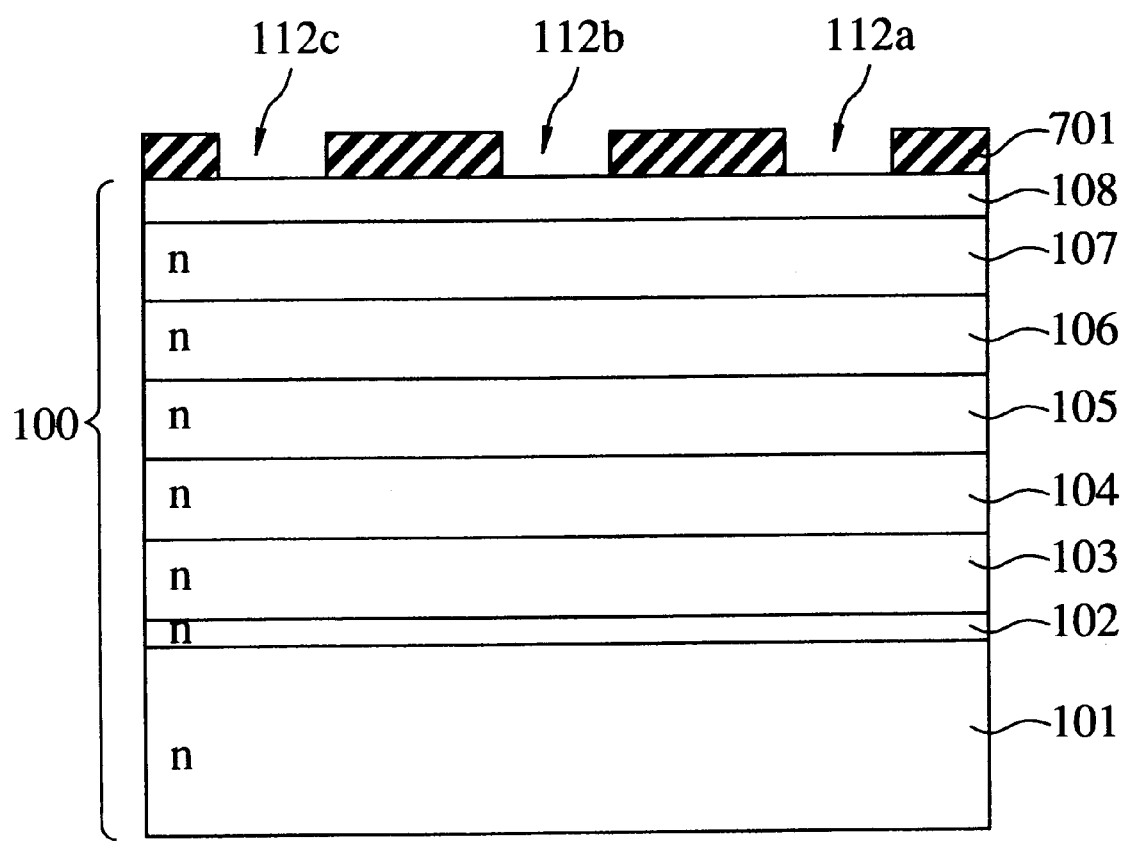
FIG. 5 is a sectional view for explaining an example of a manufacturing process of the light emitting semiconductor device of the first embodiment of the present invention (part 1)

Next, an example of a manufacturing process for the light emitting semiconductor device shown in FIGS. 1 and 2 is described in the following. FIGS. 5 to 8 are sectional views showing a manufacturing process for a light emitting semiconductor device of the first embodiment of the present invention. First, as shown in FIG. 5, a semiconductor body 100 is made by epitaxial-growing a plurality of semiconductor layers in sequence on a semiconductor substrate, for example, an n-type GaAs substrate by means of an MOCVD method or an MBE method. That is to say, an n-type GaAs buffer layer 102, an n-type $Al_sGa_{1-s}As$ layer (fifth semiconductor layer) 103, an n-type $Al_xGa_{1-x}As$ layer (first semiconductor layer) 104, an n-type $Al_yGa_{1-y}As$ layer (second semiconductor layer) 105, an n-type $Al_zGa_{1-z}As$ layer (third semiconductor layer) 106, an n-type $Al_tGa_{1-t}As$ layer (fourth semiconductor layer) 107, and a semi-insulating GaAs layer 108 each of which is an epitaxial layer are formed in sequence on the n-type GaAs substrate 101. In this case, Al composition ratios of the first semiconductor layer 104 to the fourth semiconductor layer 107 and the fifth semiconductor layer 103 are set so that x=0.1, y=0.25, z=0.4 and t=s=0.6. It is set that the n-type GaAs buffer layer 102 is about 0.1 μm in thickness, each of the first to fourth semiconductor layers 104 to 107 and the fifth semiconductor layer 103 is about 0.3 μm in thickness, and the semi-insulating GaAs layer 108 is about 0.05 μm in thickness. At this time, the total thickness of the respective epitaxial layers becomes about 1.65 μm, and the total layer thickness from the upside of the semiconductor body 100 to the upside surface of the fifth semiconductor layer 103 becomes 1.25 μm.

Next, a diffusion mask film 701 (interlayer insulating film 109) is formed on the upper surface of the semiconductor body 100 (the upside of the semi-insulating GaAs layer 108). The first opening 112a for exposing an upside area reserved to form the first p-type domain (that is, an upside area of the semiconductor body for a p-type impurity to be doped therefrom) on the upside of the semiconductor body 100, the second opening 112b for exposing an upside area reserved to form the second p-type domain, and the third opening 112c for exposing an upside area reserved to form the third p-type domain, are formed in this diffusion mask film 701. An SiN film (silicon nitride film) for example is used as the diffusion mask film 701. The diffusion mask film 701 may be an insulating film which can only prevent a p-type impurity from diffusing into the semiconductor substrate 100 in a p-type impurity diffusion process as described later.

Figure 6:
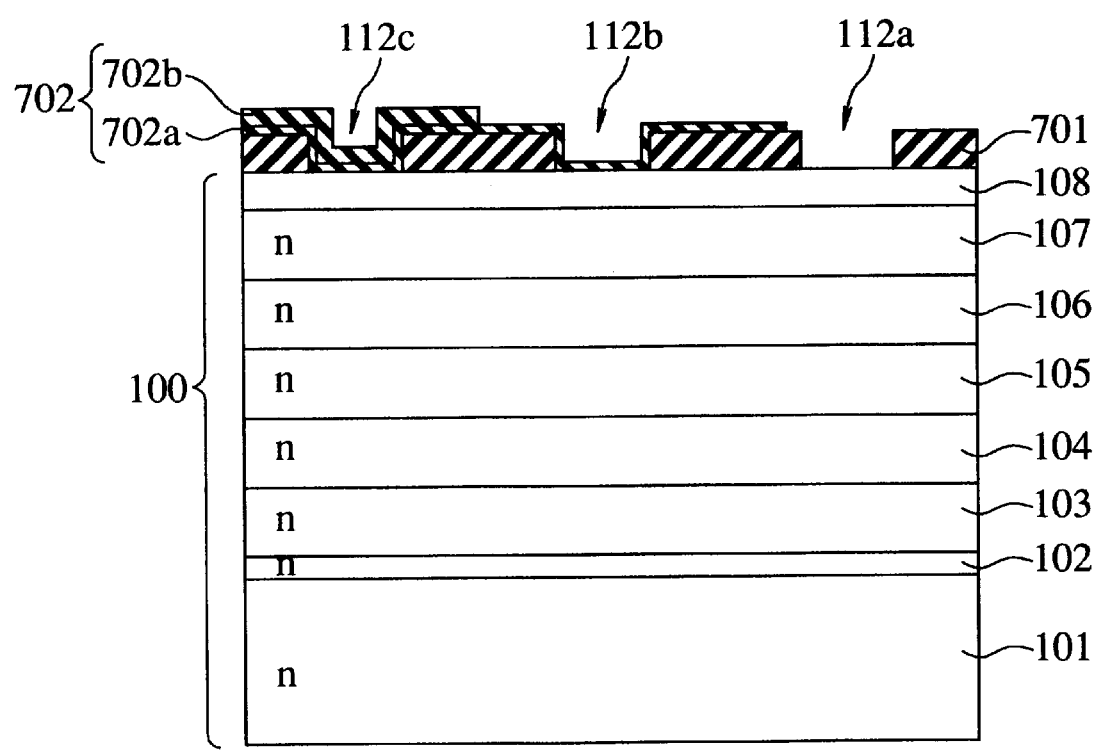
FIG. 6 is a sectional view for explaining an example of a manufacturing process of the light emitting semiconductor device of the first embodiment of the present invention (part 2)

Next, as shown in FIG. 6, a diffusion control film (doping control film) 702 is formed. An SiN film (silicon nitride film) for example is used as the diffusion control film 702. That is to say, a first SiN film 702a of about 100 Å in thickness to be the diffusion control film 702 is formed on the semiconductor body 100 on which the diffusion mask film 701 and the openings 112a, 112b and 112c have been already formed. Then, portions of the first SiN film on the first opening 112a is removed. A second SiN film 702b of about 100 Å in thickness to be the diffusion control film 702 is formed on the upside including the remaining first SiN film 702a. After this, a portion of the second SiN film on the first and second openings 112a and 112b are removed, and the diffusion control film 702 is formed by the remaining second SiN film 702b and the remaining first SiN film 702a. Thus, a structure can be formed where the reserved area for the first p-type domain in the first opening 112a is exposed, the reserved area for the second p-type domain in the second opening 112b is covered with a diffusion control film 702 of about 100 Å, and the reserved area for the third p-type domain in the third opening 112c is covered with a diffusion control film 702 of about 200 Å. The diffusion control film 702 may be an insulating film which can control the depth to which a p-type impurity diffuses into the semiconductor body 100 in a p-type impurity diffusing process as described later. An $SiO_2$ film for example can be used as the diffusion control film 702.

Figure 7:
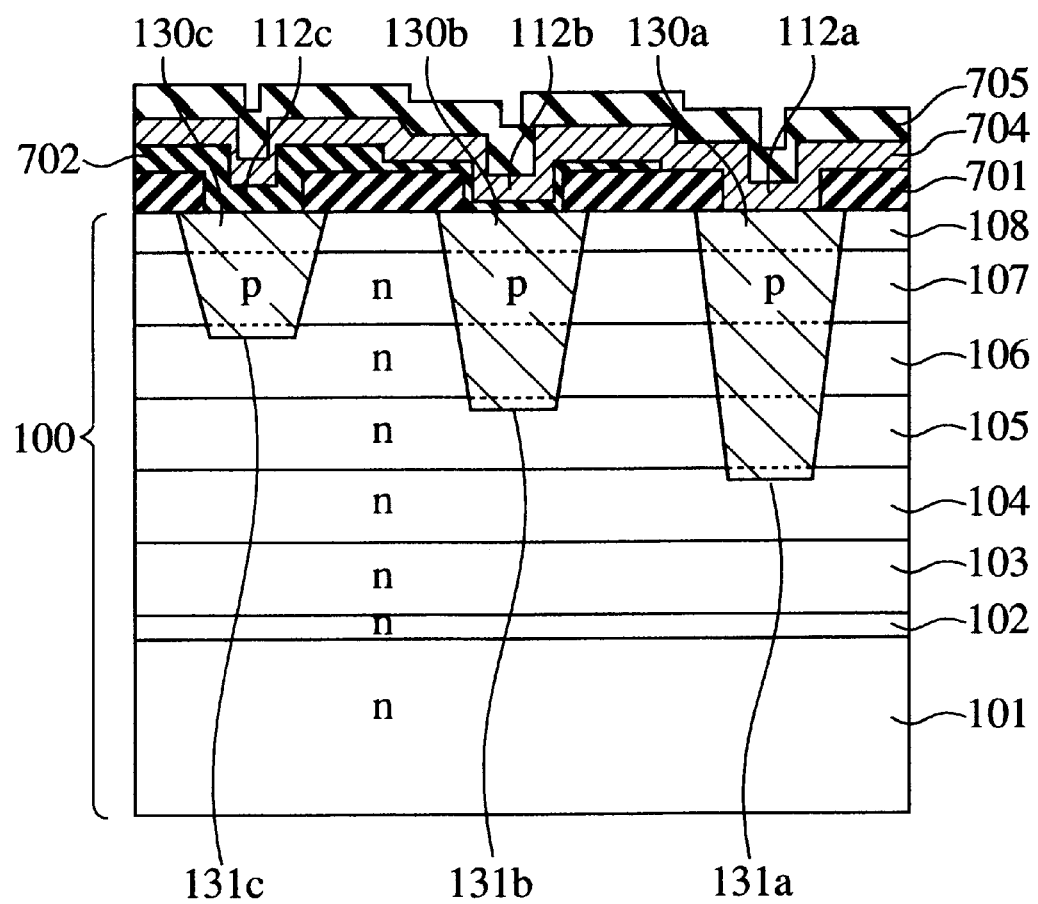
FIG. 7 is a sectional view for explaining an example of a manufacturing process of the light emitting semiconductor device of the first embodiment of the present invention (part 3)

Next, a diffusion source film 704 for diffusing a p-type impurity and an annealing cap film 705 are formed, and thereby a structure as shown in FIG. 7 can be obtained. The diffusion source film 704 is a film containing the above-mentioned p-type impurity. The annealing cap film 705 formed on the diffusion source film 704 so as to cover it is an insulating film for preventing the p-type impurity from contaminating a diffusion furnace. In this case, Zn (zinc) is used as the p-type impurity. And here a ZnSiO film ($SiO_2$ film containing Zn) is used as the diffusion source film 704. An AlN film (aluminum nitride film) for example is used as the annealing cap film 705.

Next, by annealing a structure shown in FIG. 7 by means of an open tube method, the p-type domains 130a, 130b and 130c are formed on the upside of and inside the semiconductor body 100. That is to say, by diffusion-annealing the semiconductor body 100 on which the annealing cap film 705 has been already formed, Zn is diffused into the semiconductor body 100 only through the reserved areas for the first to third p-type domains of the openings 112a, 112b and 112c, respectively, to different depths corresponding to the respective thickness of the diffusion control film 702. This Zn diffusion forms the first p-type domain 130a having the pn front 131a inside the first semiconductor layer 104, the second p-type domain 130b having the pn front 131b inside the second semiconductor layer 105, and the third p-type domain 130c having the pn front 131c inside the third semiconductor layer 106. In this case, a diffusion-annealing condition of annealing for four hours at 650° C. in a nitrogen atmosphere is adopted. Since the total layer thickness from the upside of the semiconductor body 100 to the upside surface of the fifth semiconductor layer 103 is as thin as 1.25 μm as described above, the horizontal or lateral diffusion distance is small. The above-mentioned film thickness of the diffusion control film 702 and the diffusion condition are an example, and the film thickness and diffusion condition may be properly set so that a desired diffusion depth can be obtained.

Figure 8:
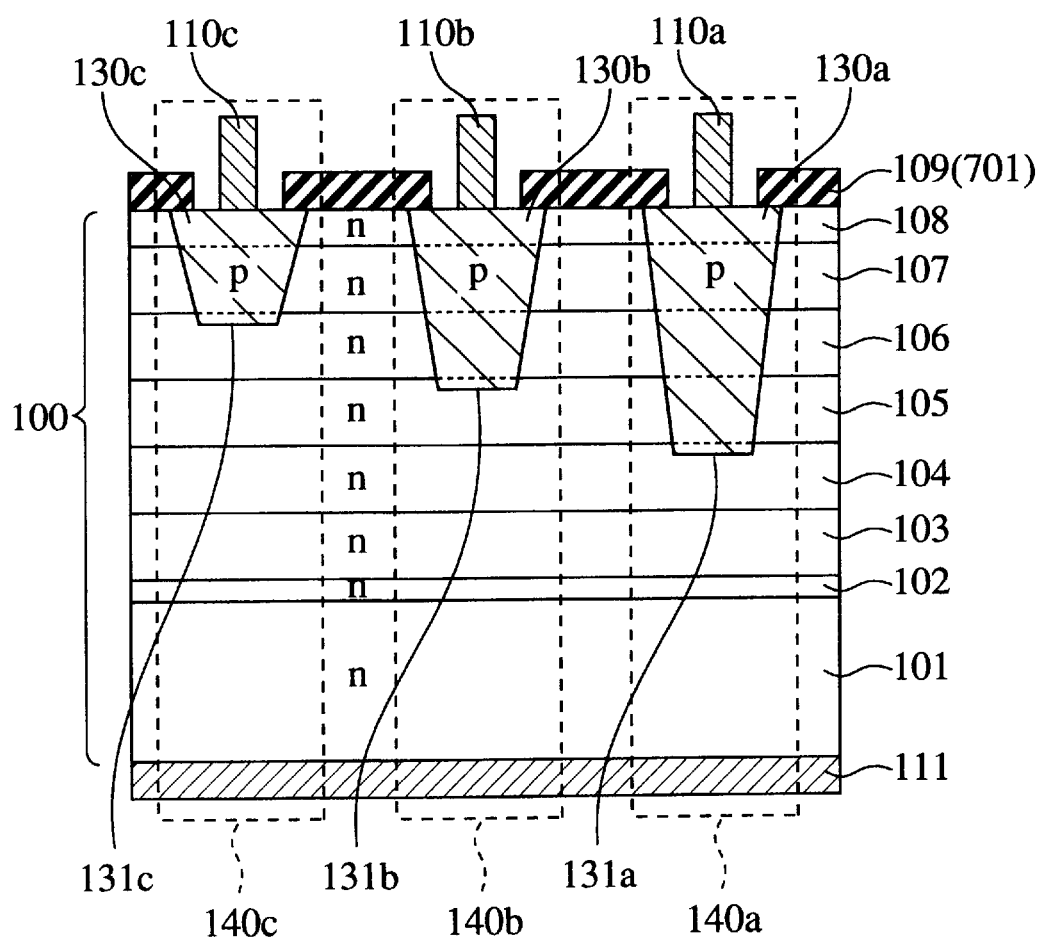
FIG. 8 is a sectional view for explaining an example of a manufacturing process of the light emitting semiconductor device of the first embodiment of the present invention (part 4)

Next, as shown in FIG. 8, the annealing cap film 705, the diffusion source film 704 and the diffusion control film 702 are removed (the diffusion mask film 701 is left as the interlayer insulating film 109), and thereby the p side electrodes 110a, 110b and 110c are formed on the upside of the semiconductor body 100. Al for example is used as the p side electrodes. That is to say, an Al film is formed on the upside of the semiconductor body 100 from which the diffusion control film 702 has been removed and this Al film is patterned to form a p side electrode pattern, and then is sintered. As a result, the first p side electrode 110a, to be in ohmic contact with the first p-type domain 130a is formed in the first opening 112a, the second p side electrode 110b to be in ohmic contact with the second p-type domain 130b is formed in the second opening 112b, and the third p side electrode 110c to be in ohmic contact with the third p-type domain 130c is formed in the first opening 112c. A metal material for the p side electrodes 110 may be any metal making it possible to come in ohmic contact with the p-type domain 130 formed in the semi-insulating GaAs layer 108, and may be a metal containing Al for example.

Next, the n side electrode 111 is formed on the reverse surface (the downside) of the semiconductor body 100. An Au (gold) alloy for example is used as this n side electrode 111. That is to say, the n side electrode 111 being in ohmic contact with the n-type GaAs substrate 101 is formed all over the reverse surface of the semiconductor body 100 by polishing the reverse surface of the semiconductor substrate 100 on which the p side electrodes 110 have been already formed (polishing the n-type GaAs substrate 101), forming an Au alloy film on the reverse surface which has been already polished, and then sintering it. By the above-mentioned process, the light emitting semiconductor device shown in FIGS. 1 and 2 is finished in which the first LED 140a, the second LED 140b and the third LED 140c are integrated.

According to the first embodiment of a light emitting semiconductor device, the first to Nth LEDs, which emit light being different in wavelength from one another, can be integrated in high density at intervals of a pitch between the p-type domains or the p side electrodes. The device is formed, as described above, by making a structure where a stacked semiconductor layer, namely, a semiconductor layer group 120 in which N semiconductor layers being different in energy band gap from one another are stacked in increasing order of energy band gap from the lower side of the substrate to the upper side (here, the N semiconductor layers are referred to as the first to Nth semiconductor layers in order from the lower side of the substrate) and the first to Nth p-type domains are provided in a semiconductor body, and the kth pn front formed by an n-type domain of the semiconductor substrate and the kth p-type domain is located inside the kth semiconductor layer.

According to a manufacturing process of the first embodiment, the depth of a pn front can be precisely controlled by forming diffusion control films being different in thickness from one another on the first to Nth upside areas of a semiconductor body into which areas a p-type impurity is to be doped before diffusion-annealing (there is an upside domain of the semiconductor body having no diffusion control film formed on it), and forming the first to Nth p-type domains whose pn fronts are different in depth from one another at the same time by a one-time diffusion-annealing operation. Furthermore, by using a solid phase diffusion method, it is possible to easily form a p-type domain whose pn front is shallow in depth and which has a high density (a low resistance), and since roughness caused by etching grooves is not formed on the upside of the semiconductor body, it is easy to form p side electrodes (or p side electrodes and an n side electrode) after this process. In addition, by forming each semiconductor layer out of an epitaxial semiconductor layer formed by means of an MOCVD method or an MBE method, the total layer thickness from the upside of the substrate to the semiconductor layer group can be precisely controlled to be thin, and due to this a shallow pn junction can be formed and the horizontal or lateral diffusion can be kept small, and therefore LEDs can be densely integrated.

In the first embodiment, a case in which LEDs are arranged in a line (a light emitting device array) is described as an example, but a light emitting semiconductor device of the present invention may be a device in which LEDs are not arranged in a line.

In the first embodiment, the first to Nth LEDs, their emitting lights being different in wavelength from one another, are integrated separately. However, in the present invention the total number of LEDs may be larger than the number of wavelengths of emitted lights (the number of semiconductor layers in a stacked semiconductor layer, namely, a semiconductor layer group). For example, the jth (j=1, . . . , N) LEDs to be integrated may be two in number. And the respective semiconductor layers forming a stacked semiconductor layer, namely, a semiconductor group to be a light emitting layer may be formed out of semiconductor materials different in energy band gap and they are not limited to the AlGaAs materials being different in Al composition ratio.

In a manufacturing process of the first embodiment, a p-type domain is formed by means of a solid phase diffusion method, but a p-type domain may be formed by means of a vapor phase diffusion method or an ion implantation method.

Second Embodiment

Figure 9:
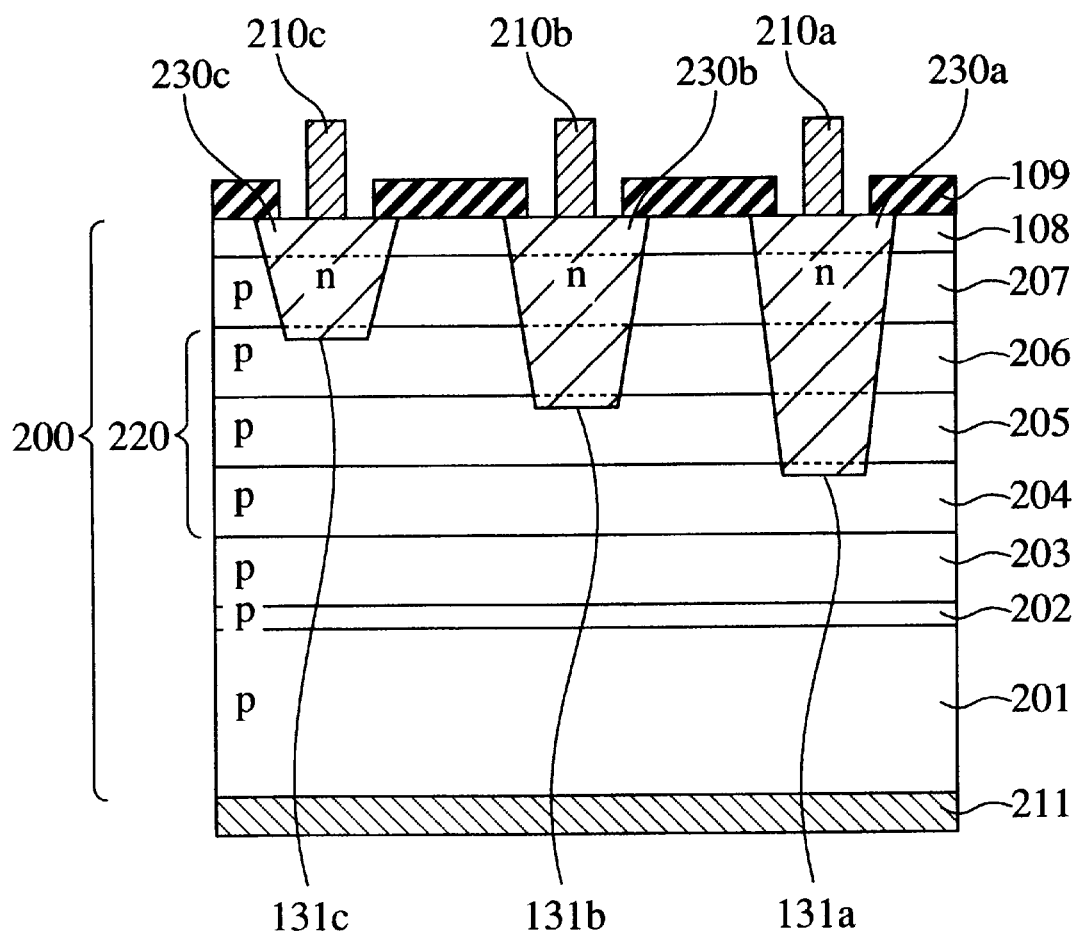
FIG. 9 is a sectional view showing the structure of a light emitting semiconductor device of a second embodiment of the present invention.

FIG. 9 is a sectional view showing the structure of a light emitting semiconductor device of a second embodiment of the present invention. In FIG. 9, the same symbols are given to the same components as those shown in FIG. 1. In an upside plan view of the light emitting semiconductor device of the second embodiment, the p-type domains and the p side electrodes of FIG. 2 are replaced, respectively, with n-type domains and n side electrodes. In the light emitting semiconductor device of FIG. 9, the p-type domains in FIG. 1 are replaced with the n-type domains and the p side electrodes are replaced with the n side electrodes. That is to say, while a pn junction is formed by doping a p-type impurity into an n-type domain of the semiconductor body in the light emitting semiconductor device of FIG. 1, a pn junction is formed by doping an n-type impurity into a p-type domain of the semiconductor body in the light emitting semiconductor device of FIG. 9.

The light emitting semiconductor device of FIG. 9 is provided with a semiconductor body 200, an interlayer insulating film 109, n side electrodes 210a, 210b and 210c, and a p side electrode 211. The semiconductor body 200 has a p-type GaAs buffer layer 202, a p-type Al$_s$Ga$_{1-s}$As layer (fifth semiconductor layer) 203, a p-type Al$_x$Ga$_{1-x}$As layer (first semiconductor layer) 204, a p-type Al$_y$Ga$_{1-y}$As layer (second semiconductor layer) 205, a p-type Al$_z$Ga$_{1-z}$As layer (third semiconductor layer) 206, a p-type Al$_t$Ga$_{1-t}$As layer (fourth semiconductor layer) 207, and a semi-insulating GaAs layer 108 which are stacked on a p-type GaAs substrate 201, and has n-type domains 230a, 230b and 230c formed by doping an n-type impurity into these semiconductor layers. In this constructional example, the first to third semiconductor layers 204 to 206 form a stacked semiconductor layer, namely, a semiconductor layer group 220 to be a light emitting layer. The energy band gaps Eg1, Eg2, Eg3, Eg4 and Eg5, and the Al composition ratios x, y, z, t and s of the first to fifth semiconductor layers 204 to 207 and 203 satisfy the condition of the above-mentioned expressions (1) to (4).

A manufacturing process for the light emitting semiconductor device of FIG. 9 makes the semiconductor body 200 by means of a semiconductor epitaxial method such as an MOCVD method or an MBE method, for example, in the same way as the above-mentioned first embodiment and forms the n-type domains 230a, 230b and 230c on this semiconductor body 200 by means of a solid phase diffusion method. The Al composition ratios of the first to fifth semiconductor layers 204 to 207 and 203 are set as x=0.1, y=0.25, z=0.4, t=s=0.6 in the same way as the first embodiment for example. As an n-type impurity, Sn (tin) or Si (silicon) for example is used. Since operation of the light emitting semiconductor device of FIG. 9 is the same as the first embodiment, description of it is omitted.

Also in a structure like the second embodiment in which the first to Nth n-type domains are formed by doping an n-type impurity into p-type domains of the semiconductor body, the first to Nth LEDs emitting lights being different in wavelength from one another can be densely integrated in the same way as the first embodiment.

Third Embodiment

Figure 10:
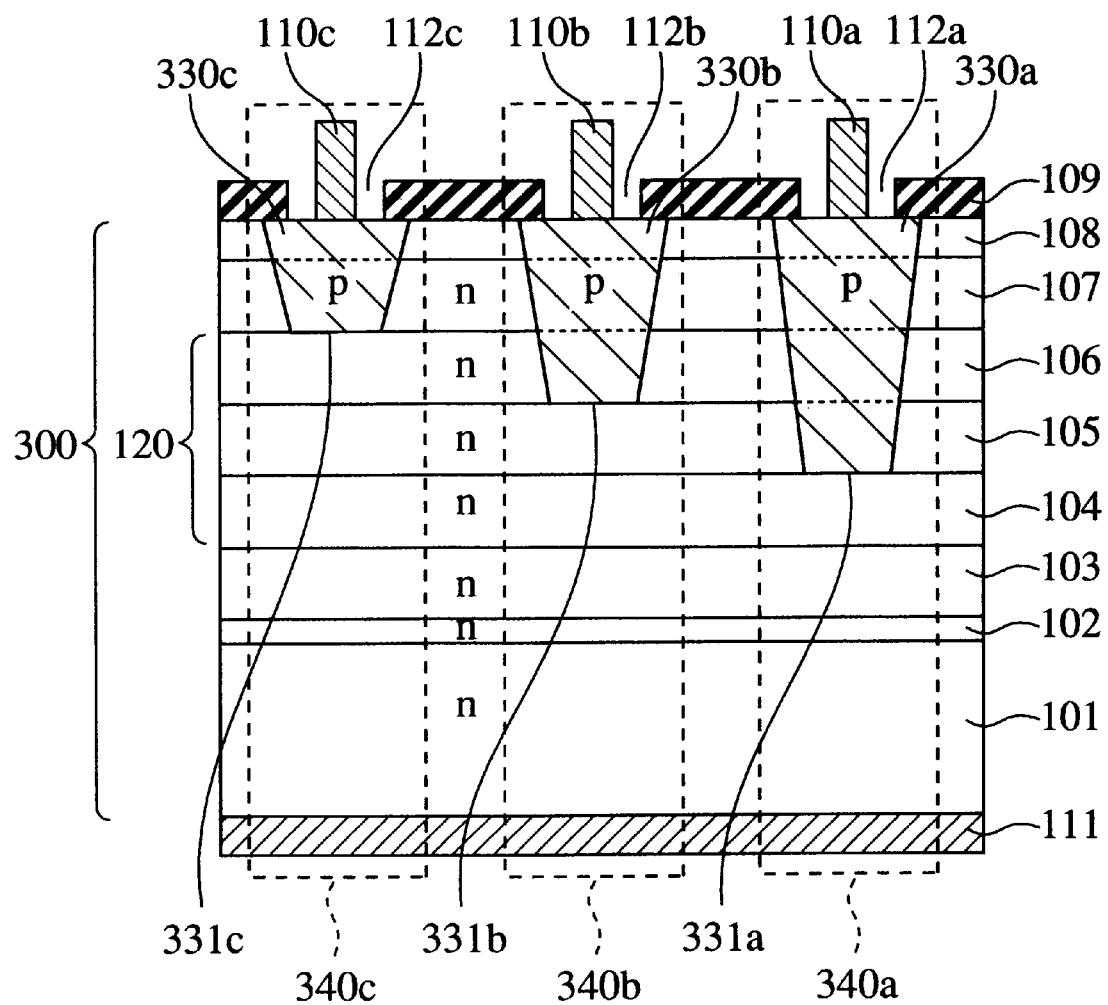
FIG. 10 is a sectional view showing the structure of a light emitting semiconductor device of a third embodiment of the present invention.

FIG. 10 is a sectional view showing the structure of a light emitting semiconductor device of a third embodiment of the present invention. In FIG. 10, the same symbols are given to the same components as those shown in FIG. 1. An upside plan view of the light emitting semiconductor device of the third embodiment is the same as FIG. 2. The light emitting semiconductor device of FIG. 10 has a pn front formed on the upside of a semiconductor layer to be a light emitting layer in FIG. 1. That is to say, while pn fronts are respectively formed inside the first to third semiconductor layers 104 to 106 of a stacked semiconductor layer, namely, a semiconductor layer group in the light emitting semiconductor device of FIG. 1, pn fronts are formed respectively on the upsides of the first to third semiconductor layers 104 to 106 (in the interface between each semiconductor layer and its upper layer) in the light emitting semiconductor device of FIG. 10.

A semiconductor body 300 of the light emitting semiconductor device of FIG. 10 is formed by stacking the respective semiconductor layers of an n-type GaAs buffer layer 102 to a semi-insulating GaAs layer 108 on the n-type GaAs substrate 101, doping selectively a p-type impurity (Zn for example) into the semiconductor layers from the upper surface, and thus forming p-type domains 330a, 330b and 330c. The first pn front 331a by the first p-type domain 330a is formed on the upside of the first semiconductor layer 104 (in the interface between the first semiconductor layer 104 and the second semiconductor layer 105). The second pn front 331b by the second p-type domain 330b is formed on the upside of the second semiconductor layer 105 (in the interface between the second semiconductor layer 105 and the third semiconductor layer 106). The third pn front 331c by the third p-type domain 330c is formed on the upside of the third semiconductor layer 106 (in the interface between the third semiconductor layer 106 and the fourth semiconductor layer 107). The p-domains 330a, 330b and 330c each of which has its pn front in the interface between the semiconductor layers can be formed by a manufacturing process for example using a solid phase diffusion method as described in the first embodiment.

The first p side electrode 110a, the first p-type domain 330a, the n-type domains of the semiconductor body 300 and the n side electrode 111 form the first LED 340a. The second p side electrode 110b, the second p-type domain 330b, the n-type domains of the semiconductor body 300 and the n side electrode 111 form the second LED 340b. The third p side electrode 110c, the third p-type domain 330c, the n-type domains of the semiconductor body 300 and the n side electrode 111 form the third LED 340c.

Since a light emitting semiconductor device of the present invention has a structure in which the energy band gap of each of the semiconductor layers which are upper (at the upper side of the semiconductor body) than a pn front is larger than the energy band gap of a semiconductor layer in which the pn front is formed (a semiconductor layer at the downside of the pn front in this third embodiment), no electron is injected through a pn junction formed in a semiconductor layer being upper than a pn front 331 in LED 340 and almost all current flows through the pn front 331. Since the energy band gap of the p-type domain 330 is larger than the energy band gap of an n-type domain forming the pn front 331 with this p-type domain 330, almost all light is generated in the n-type domains in the vicinity of the pn front 331. In the LED 340a for example, a light is generated in the first semiconductor layer 104 in the vicinity of the pn front 331a, and this light passes the second to fourth semiconductor layers 105 to 107 without being absorbed in the least and is emitted through the first opening 112a and its peripheral part.

Since the wavelength of a light emitted by LED 340 is a wavelength corresponding to the energy band gap of a semiconductor layer (light emitting layer) at the downside (lower surface) of the pn front 331, the wavelength of a light emitted by the first LED 340a is the same as the first LED 140a of FIG. 1, the wavelength of a light emitted by the second LED 340b is the same as the second LED 140b of FIG. 1, and the wavelength of a light emitted by the third LED 340c is the same as the third LED 140c of FIG. 1.

An upper layer having a larger energy band gap than the light emitting layer does not absorb a light generated in the light emitting layer, and injected carriers are confined inside the light emitting layer by energy barriers of the upper and lower layers than the light emitting layer. Therefore, it is possible to make high the light emitting efficiency of an LED in the same way as the first embodiment. Furthermore, since this embodiment has a structure in which a generated light does not pass the p-type domain of a light emitting layer and no light is absorbed by the p-type domain inside the light emitting layer, it can make the light emitting efficiency of an LED higher than the first embodiment.

According to the third embodiment, as described above, it is possible to make the light emitting efficiency of an LED higher than the first embodiment by forming a pn front on the upside of a semiconductor layer to be a light emitting layer.

Fourth Embodiment

Figure 11:
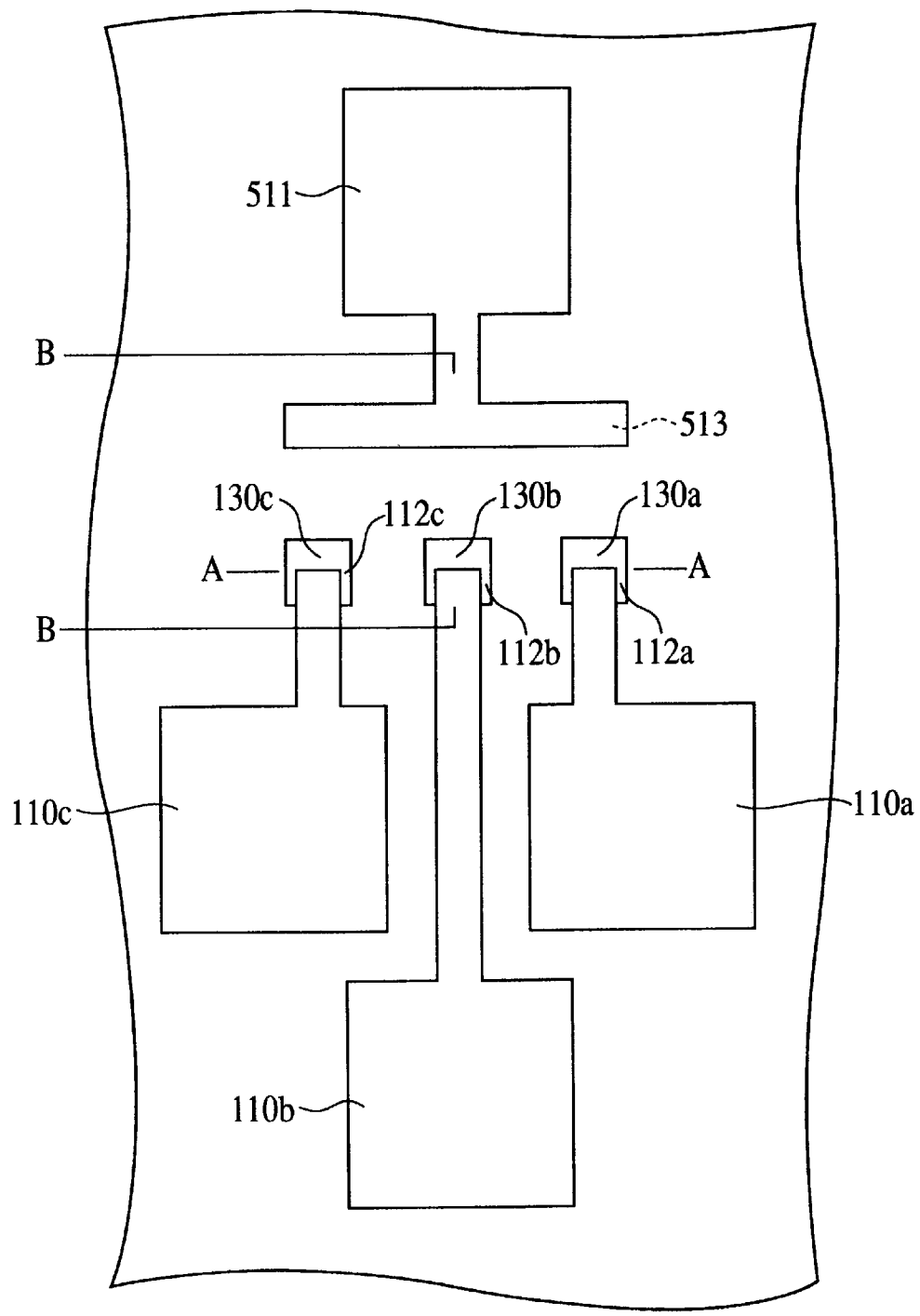
FIG. 11 is an upside plan view showing the structures of light emitting semiconductor devices of a fourth and a fifth embodiment of the present invention.
Figure 12:
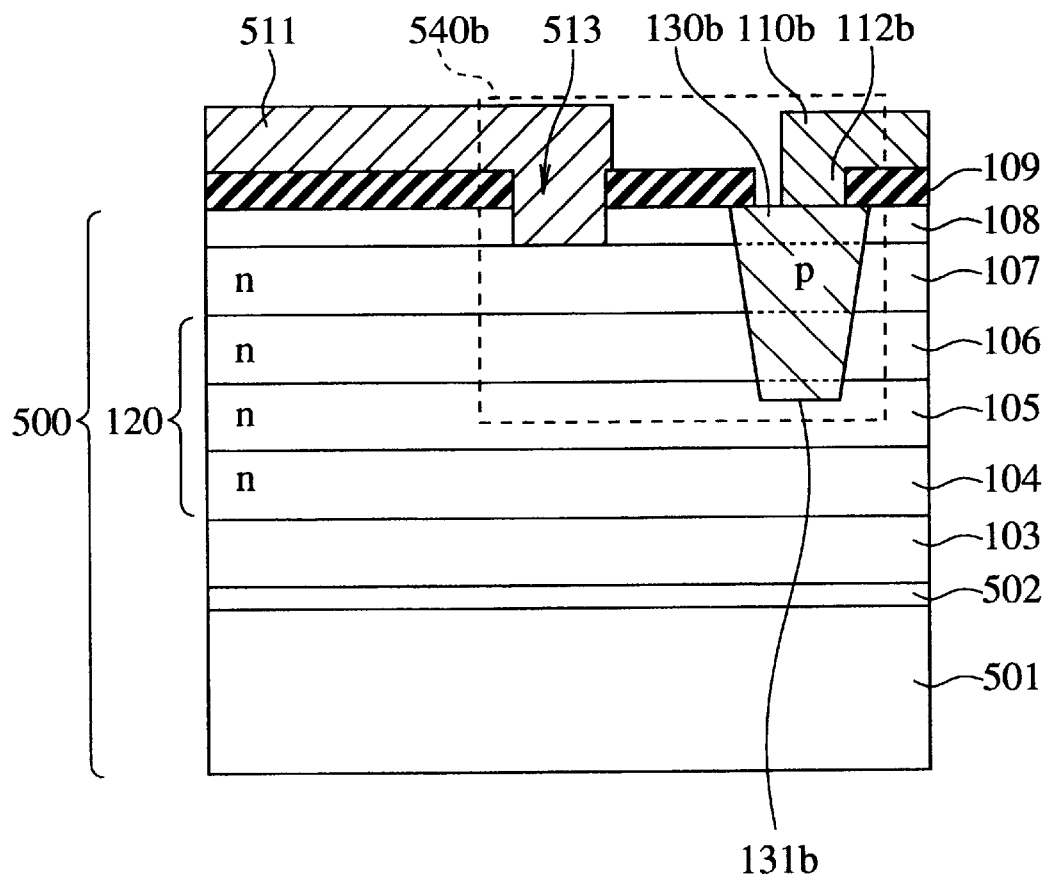
FIG. 12 is a sectional view taken between B–B' for showing the structure of the light emitting semiconductor device of the fourth embodiment of the present invention.

FIG. 11 is an upside plan view showing the structure of a light emitting semiconductor device of a fourth embodiment of the present invention. FIG. 12 is a sectional view showing the structure of the light emitting semiconductor device of the fourth embodiment, which is a sectional view taken between B—B in FIG. 11. In FIGS. 11 and 12, the same symbols are given to the same components as those of FIGS. 1 or 2. The light emitting semiconductor device shown in FIGS. 11 and 12 is obtained by providing the n side electrode shown in FIGS. 1 and 2 on the upside of the substrate rather than the downside.

The light emitting semiconductor device of FIGS. 11 and 12 is provided with a semiconductor body 500, an interlayer insulating film 109, p side electrodes 110a, 110b and 110c, and an n side electrode 511. The semiconductor body 500 has semiconductor layers of a semi-insulating GaAs buffer layer 502, the fifth semiconductor layer 103 to a semi-insulating GaAs layer 108 which are stacked on a semi-insulating GaAs substrate 501, and has p-type domains 130a, 130b and 130c formed by selectively doping a p-type impurity from the upside of the substrate. The n side domain of the semiconductor body 500 is composed of the fifth semiconductor layer 103 and other domains than the p-type domains 130 of the first to fourth semiconductor layers 104 to 107. The first to third semiconductor layers 104, 105 and 106 form a stacked semiconductor layer 120.

The n side electrode 511 is provided on the upside of the semiconductor body 500 and is in ohmic contact with an n-type domain of the fourth semiconductor layer 107. This n side electrode 511 can be formed by forming an opening 513 for exposing the fourth semiconductor layer 107 in the interlayer insulating film 109 and the GaAs layer 108 and patterning a metal material (Au alloy for example) to form the n side electrode 511 on an upper side area of the semiconductor body including this opening 513 and then sintering it. Also a structure in which no opening is formed in the GaAs layer 108 and the n side electrode 511 is brought into ohmic contact with an n-type domain which is partially formed in the GaAs layer 108 and reaches the fourth semiconductor layer 107 will do.

The first p side electrode 110a, the first p-type domain 130a, the n-type domain of the semiconductor body 500 and the n side electrode 511 form a first LED not illustrated. The second p side electrode 110b, the second p-type domain 130b, the n-type domain of the semiconductor body 500 and the n side electrode 511 form a second LED 540b. The third p side electrode 110c, the third p-type domain 130c, the n-type domain of the semiconductor body 500 and the n side electrode 511 form a third LED not illustrated. In an LED of this semiconductor device of the fourth embodiment also, since almost all electrons injected into the n-type domain of the semiconductor body 500 from the n side electrode 511 are injected through a pn front 131 into a p-type domain 130, it can make high the light emitting deficiency of the LED in the same way as the first embodiment. The GaAs buffer layer 502 and the GaAs substrate 501 may be of n type or p type.

Also in such a structure as the fourth embodiment where the n side electrode is provided on the upside of the semiconductor body rather than the downside, LEDs emitting lights different in wavelength from one another can be densely integrated in the same way as the first embodiment.

Fifth Embodiment

Figure 13:
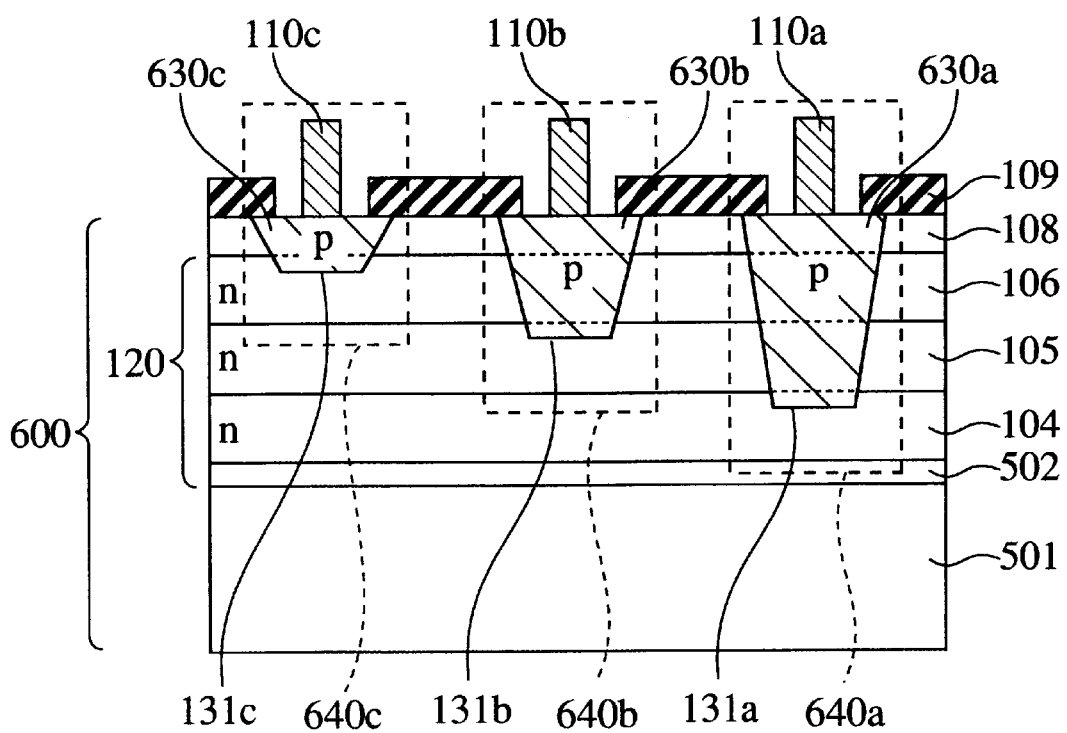
FIG. 13 is a sectional view taken between A–A' for showing the structure of the light emitting semiconductor device of the fifth embodiment of the present invention.
Figure 14A:
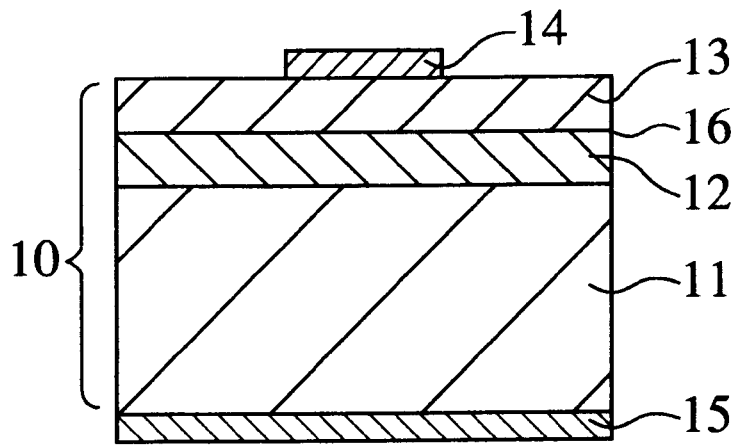
FIGS. 14(A)–14(C) are sectional views showing the structure of a conventional light emitting semiconductor device.
Figure 14B:
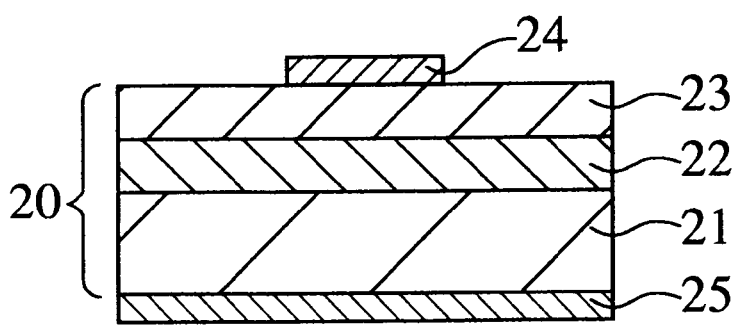
Figure 14C:
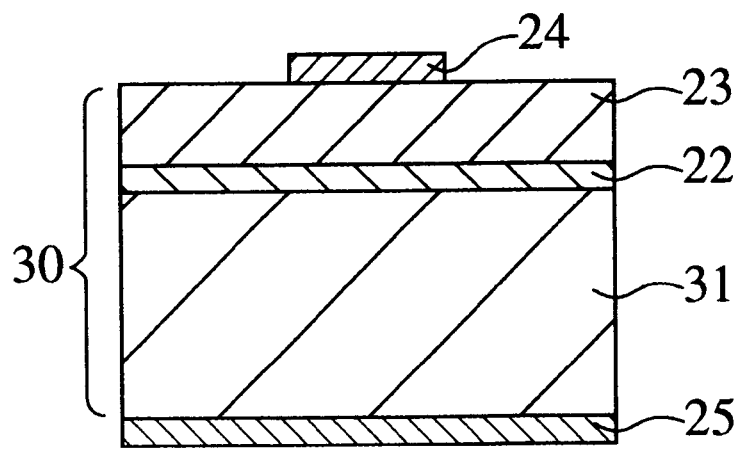

FIG. 13 is a sectional view showing the structure of a light emitting semiconductor device of a fifth embodiment of the present invention. In FIG. 13, the same symbols are given to the same components as those of FIGS. 1, 11 or 12. An upside plan view of the light emitting semiconductor device of the fifth embodiment shows the p-type domains 130a, 130b and 130c in FIG. 11 as 630a, 630b and 630c, respectively, and a sectional view taken between A—A of this upside plan view (FIG. 11) is FIG. 13. The light emitting semiconductor device shown in FIG. 13 has a structure in which the fourth semiconductor layer 107 and the fifth semiconductor layer 103 to be cladding layers in the light emitting semiconductor device of the fourth embodiment are not provided.

The light emitting semiconductor device of FIG. 13 is provided with a semiconductor body 600, an interlayer insulating film 109, p side electrodes 110a, 110b and 110c, and an n side electrode 511 (see FIG. 11, not illustrated in FIG. 13). The semiconductor body 600 comprises a semi-insulating GaAs substrate 501, a stacked semiconductor layer 120, and a semi-insulating GaAs layer 108. The stacked semiconductor layer 120 is formed by stacking a semi-insulating GaAs buffer layer 502, an n-type $Al_xGa_{1-x}As$ layer (first semiconductor layer) 104, an n-type $Al_yGa_{1-y}As$ layer (second semiconductor layer) 105 and an n-type $Al_zGa_{1-z}As$ layer (third semiconductor layer) 106 on the semi-insulating GaAs substrate 501. A semi-insulating GaAs layer 108 is stacked on this stacked semiconductor layer 120. The light emitting semiconductor device is formed by the p-type domains 630a, which 630b and 630c are formed by selectively doping a p-type impurity (Zn for example) from the upside of the semiconductor body.

The first p-type domain 630a is formed in partial domains of the GaAs layer 108 and the third semiconductor 106 to the first semiconductor layer 104. The second p-type domain 630b is formed in partial domains of the GaAs layer 108, the third semiconductor 106 and the second semiconductor layer 105. The third p-type domain 630c is formed in partial domains of the GaAs layer 108 and the third semiconductor 106. The pn fronts 131a, 131b and 131c of the p-type domains 630a, 630b and 630c are respectively formed inside the first semiconductor layer 104, the second semiconductor layer 105 and the third semiconductor layer 106 in the same way as the first or fourth embodiment. The n-type domain of the semiconductor body 600 is composed of other domains than the p-type domains 630 of the first to third semiconductor layers 104 to 106. And the n side electrode 511 is provided on the upside of the semiconductor body 600 and is in ohmic contact with an n-type domain of the third semiconductor layer 106 or an n-type domain which is partially formed in the GaAs layer 108 and reaches the third semiconductor layer 106.

The first p side electrode 110a, the first p-type domain 630a, the n-type domain of the semiconductor body 600 and the n side electrode 511 form a first LED 640a. The second p side electrode 110b, the second p-type domain 630b, the n-type domain of the semiconductor body 600 and the n side electrode 511 form a second LED 640b. The third p side electrode 110c, the third p-type domain 630c, the n-type domain of the semiconductor body 600 and the n side electrode 511 form a third LED 640c.

In an LED 640 also, in the same way as the first embodiment, no carrier is injected through a pn junction formed in a semiconductor layer being upper than the semiconductor layer in which there is a pn front 131.

Therefore, almost all current flows through the pn junction inside the semiconductor layer in which there is the pn front 131. Since the wavelength of a light generated by an LED 640 is a wavelength corresponding to the energy band gap of a semiconductor layer (light emitting layer) in which a pn front 131 is formed, the wavelengths of lights generated by the LEDs 640*a*, 640*b* and 640*c* are respectively the same as the LEDs 140*a*, 140*b* and 140*c* of FIG. 1. And since the upper layers being larger in energy band gap than the light emitting layer do not absorb a light generated in the light emitting layer, the light emitting efficiency of an LED can be made high.

Since the light emitting semiconductor device of FIG. 13 is not provided with the fourth semiconductor layer 107 and the fifth semiconductor layer 103, the total thickness of the respective semiconductor layers can be made thinner than the first embodiment. For example, these semiconductor layers, which are made of epitaxial layers, are formed by an epitaxial method as described in the first embodiment. In case of making the first to third semiconductor layers 104 to 106 respectively be 0.3 $\mu$m in thickness and the GaAs buffer layer 502 be 0.1 $\mu$m in thickness and the GaAs layer 108 be 0.05 $\mu$m in thickness in the same way as the first embodiment, the total layer thickness can be made about 1 $\mu$m. Particularly thanks to making it possible to make thin the total layer thickness of the first semiconductor layer 104 to the GaAs layer 108, since the p-type domains 630*a*, 630*b* and 630*c*, respectively, can be made more shallow in diffusion depth than the p-type domains 130*a*, 130*b* and 130*c* of the first embodiment, the horizontal or lateral diffusion is made less and LEDs can be more densely integrated. Since a process for forming the semiconductor layers on the GaAs substrate 501 can be simplified and a time required for this process and a process for forming p-type domains can be shortened, the manufacturing cost can be reduced.

According to the fifth embodiment, as described above, LEDs can be more densely integrated and the manufacturing cost can be reduced by making semi-insulative the GaAs buffer layer 502 on the downside of the semiconductor layer group 120 without providing semiconductor layers to be clad layers on the upside and the downside of the stacked semiconductor layer, namely, the semiconductor layer group 120 to be a light emitting layer.

According to the present invention, as described above, a structure in which the first to Nth p-type domains being different in depth from one another are formed in a semiconductor body. The semiconductor body has a stacked semiconductor layer, namely, a semiconductor layer group (comprising semiconductor layers referred to as the first to Nth semiconductor layers in sequence from the lower side) in which N semiconductor layers being different in energy band gap from one another are stacked in increasing order of energy band gap from the lower side of the semiconductor body to the upper side. The kth pn front made by the first conductive-type domain and the kth p-type domain of the semiconductor body is located inside or on the upside of the kth semiconductor layer. Therefore, the present invention has an effect of making it possible to integrate the first to Nth LEDs emitting lights being different in wavelength from one another at intervals of a pitch between the p-type domains or the p side electrodes more densely than the prior art.

What is claimed is:

1. A light emitting semiconductor device having a plurality of light emitting elements respectively emitting light of different wavelength, comprising:

a semiconductor body having a first conductive-type domain and a plurality of individual second conductive-type domains;

a first conductive electrode being in contact with said first conductive-type domain; and a plurality of second conductive electrodes being individually in contact with said plurality of second conductive-type domains, said semiconductor body being composed of a plurality of semiconductor layers each of which is a light emitting layer stacked on one another and comprising a stacked semiconductor layer partially forming said first conductive-type domain, said semiconductor body having a substantially planar upper surface, said second conductive-type domains being respectively formed from parts of the substantially planar upper surface of said semiconductor body and extending to said semiconductor layers, said second conductive-type domains having respectively different depths, said first conductive-type domain and said plurality of second conductive-type domains forming a plurality of pn junction interfaces, said semiconductor layers having energy band gaps different from one another and being stacked in increasing order of energy band gap from a lower side of said semiconductor body to the substantially planar upper surface, and one or more pn junction front portions being formed inside or on respective upper surfaces of said semiconductor layers.

2. The light emitting semiconductor device as defined in claim 1, wherein said semiconductor layers are a plurality of AlGaAs layers having respectively different Al composition ratios.

3. The light emitting semiconductor device as defined in claim 1, wherein said semiconductor body further includes another upper semiconductor layer which is located on an upper surface of said stacked semiconductor layer and which has an energy band gap larger than an energy band gap of a top semiconductor layer of said stacked semiconductor layer.

4. The light emitting semiconductor device as defined in claim 3, wherein said top semiconductor layer and said another upper semiconductor layer are AlGaAs layers, an Al composition ratio of said another upper semiconductor layer being larger than an Al composition ratio of said top semiconductor layer.

5. The light emitting semiconductor device as defined in claim 1, wherein said semiconductor body further includes another lower semiconductor layer which is located on a bottom surface of said stacked semiconductor layer and which has an energy band gap larger than an energy band gap of a bottom semiconductor layer of said stacked semiconductor layer.

6. The light emitting semiconductor device as defined in claim 5, wherein said bottom semiconductor layer and said another lower semiconductor layer are AlGaAs layers, an Al composition ratio of said another lower semiconductor layer being larger than an Al composition ratio of said bottom semiconductor layer.

7. The light emitting semiconductor device as defined in claim 1, wherein said semiconductor body further includes a semi-insulating semiconductor layer formed at a side of said semiconductor body lower than said stacked semiconductor layer, said first conductive electrode and said second conductive electrodes being formed on the substantially planar upper surface of said semiconductor body.

8. The light emitting semiconductor device as defined in claim 1, wherein said semiconductor body further includes a contact semiconductor layer as a top layer forming ohmic contact with said second conductive electrodes, said contact semiconductor layer being composed of part of said second conductive-type domain and part of a semi-insulating semiconductor region.

9. The light emitting semiconductor device as defined in claim 1, wherein said second conductive-type domains are formed as domains into which a second conductive-type impurity is selectively doped from the substantially planar upper surface of said semiconductor body.

10. The light emitting semiconductor device as defined in claim 9, wherein said semiconductor body is formed from semiconductors of group III to V elements, said first conductive-type domain being n type and an impurity of said second conductive-type domains being Zn.

11. The light emitting semiconductor device as defined in claim 9, wherein said semiconductor body is formed from semiconductors of group III to V elements, said first conductive-type domain being p type and an impurity of said second conductive-type domains being Sn or Si.

* * * * *